United States Patent
Kost

(10) Patent No.: US 8,081,028 B2
(45) Date of Patent: Dec. 20, 2011

(54) SYSTEMS AND METHODS FOR IMPROVED OVER-CURRENT CLIPPING

(75) Inventor: Michael A. Kost, Cedar Park, TX (US)

(73) Assignee: Intersil Americas Inc., Milpitas, CA (US)

( * ) Notice: Subject to any disclaimer, the term of this patent is extended or adjusted under 35 U.S.C. 154(b) by 493 days.

(21) Appl. No.: 12/346,211

(22) Filed: Dec. 30, 2008

(65) Prior Publication Data

US 2009/0169022 A1 Jul. 2, 2009

Related U.S. Application Data

(60) Provisional application No. 61/018,301, filed on Dec. 31, 2007.

(51) Int. Cl.
*H03F 3/38* (2006.01)
*H03G 11/00* (2006.01)
(52) U.S. Cl. ............. 330/10; 330/298; 381/55; 381/120
(58) Field of Classification Search .................... 330/10, 330/298, 207 P; 381/55, 120
See application file for complete search history.

(56) References Cited

U.S. PATENT DOCUMENTS

| | | | |
|---|---|---|---|
| 5,050,172 A | 9/1991 | Elms et al. | |
| 5,493,296 A | 2/1996 | Sugihara | |
| 5,510,753 A | 4/1996 | French | |
| 5,528,695 A | 6/1996 | Klippel | |
| 5,649,054 A | 7/1997 | Oomen et al. | |
| 6,038,516 A | 3/2000 | Alexander et al. | |
| 6,157,331 A | 12/2000 | Liu et al. | |
| 6,498,531 B1 | 12/2002 | Ulrick et al. | |
| 6,683,494 B2 | 1/2004 | Stanley | |
| 6,816,017 B2 | 11/2004 | Yamashita et al. | |
| 6,853,242 B2 | 2/2005 | Melanson et al. | |

(Continued)

FOREIGN PATENT DOCUMENTS

EP 1 128 549 A2 8/2001
(Continued)

OTHER PUBLICATIONS

English Language translation of Office Action dated Jan. 13, 2009, for Japanese Patent Application No. 2006-507396.

(Continued)

*Primary Examiner* — Minh-Loan T Tran
(74) *Attorney, Agent, or Firm* — Fliesler Meyer LLP

(57) ABSTRACT

Systems and methods for implementing over-current protection in amplifiers are provided, including systems, methods and devices for specifying a clip level at which to clip an audio signal in response to an over-current condition being detected. In an embodiment, the clip level is reduced while the over-current condition is being detected. Once the over-current condition is no longer detected, the clip level is maintained for a specified period before allowing the clip level to be increased. In an embodiment, the specified period, for which the clip level is maintained before the clip level is allowed to be increased, starts when the over-current condition is no longer detected, and ends when each of N immediately preceding sample(s) of the audio signal are not clipped to the clip level, where N is an integer, and $N \geq 1$. After an over-current condition is no longer detected, and after the clip level has been maintained for the specified period, the clip level can be increased if an over-current condition is not detected for a sample and the clip level is below a specified maximum clip level.

20 Claims, 6 Drawing Sheets

U.S. PATENT DOCUMENTS

| | | | |
|---|---|---|---|
| 6,972,705 | B1 | 12/2005 | Fei et al. |
| 7,286,010 | B2 * | 10/2007 | Chieng et al. .................. 330/10 |
| 7,346,113 | B2 | 3/2008 | Hansen et al. |
| 2002/0085725 | A1 | 7/2002 | Bizjak |
| 2004/0130472 | A1 | 7/2004 | Arizumi et al. |
| 2004/0135635 | A1 | 7/2004 | Noro |
| 2004/0184621 | A1 | 9/2004 | Andersen et al. |

FOREIGN PATENT DOCUMENTS

| | | |
|---|---|---|
| JP | 03-265309 | 11/1991 |
| JP | 2008-330875 | 12/1996 |
| JP | 2003-037452 | 2/2003 |
| JP | 2004-222251 | 8/2004 |
| JP | 2007-0005958 | 1/2007 |
| JP | 2007-074431 | 3/2007 |
| WO | WO01/26222 | 4/2001 |

OTHER PUBLICATIONS

English Language translation of Office Action dated Dec. 13, 2008, for Chinese Patent Application No. 200480009689.9.

Meier et al.: "Software Amplitude Limitation in Digital Signal Processing Applications" Motorola Technical Developments, vol. 25, Jul. 1, 1995, pp. 23-27.

Dunn et al., "Use of Clipping in Sigma-delta Modulators," IEEE Colloquium on Oversampling Techniques and Sigma-Delta Modulation, Mar. 30, 1994, pp. 8/1-8/9.

Sozanski et al., "Digital control circuit for class-D audio power amplifier," Power Electronics Specialists Conference, 2001, IEEE 32nd Annual, vol. 2, pp. 1245-1250.

Written Opinion and International Search Report for PCT/US07/60574, dated Feb. 14, 2008.

Written Opinion and International Search Report for PCT/US2008/088580, dated Aug. 12, 2009.

Office Action from Japanese Patent Office, along with the English Language translation of Japanese Patent Application No. 2008-552565, Apr. 6, 2011, 5 pages total (3 pages in Japanese and 2 pages in English).

Denon LTD, English Language translation of Japanese Patent Publication No. 2003-037452, Feb. 7, 2003, 16 pages.

Yamaha Corp, English Language translation of Japanese Patent Publication No. 2008-3308575, Dec. 13, 1996, 12 pages.

Renesas Technology Corp, English Language translation of Japanese Patent Publication No. 2004-222251, Aug. 5, 2004, 28 pages.

* cited by examiner

SYSTEMS AND METHODS FOR IMPROVED OVER-CURRENT CLIPPING

PRIORITY CLAIM

This application claims priority under 35 U.S.C. 119(e) to U.S. Provisional Patent Application 61/018,301, filed Dec. 31, 2007, which is incorporated herein by reference.

SUMMARY

Embodiments of the present invention are related to amplifiers, and methods for use with amplifiers. Further embodiments of the present invention are related to pulse width modulation (PWM) controllers of amplifiers. Still further embodiments of the present invention are related to devices that including a hard-clipping unit.

Specific embodiments related to methods, for use with amplifiers, for specifying clip level at which to clip an audio signal in response to an over-current condition being detected. In certain embodiments, the clip level is reduced while the over-current condition is being detected. More specifically, when an over-current condition is initially detected, the clip level is set to a level of an immediately preceding sample of the audio signal, if the immediately preceding sample was not clipped (and the clip level is optionally decremented after the clip level is set to the level of the immediately preceding sample). If the immediately preceding sample was clipped, the clip level is decremented. This is repeated for subsequent samples until the over-current condition is no longer detected. Once the over-current condition is no longer detected, the clip level is maintained for a specified period before allowing the clip level to be increased. In an embodiment, the specified period, for which the clip level is maintained before the clip level is allowed to be increased, starts when the over-current condition is no longer detected, and ends when each of N immediately preceding sample(s) of the audio signal are not clipped to the clip level, where N is an integer, and N≧1 (e.g., N=1, 2 or 3, but is not limited thereto). After an over-current condition is no longer detected, and after the clip level has been maintained for the specified period, the clip level is incremented if an over-current condition is not detected for a sample and the clip level is below a specified maximum clip level.

This summary is not intended to summarize all of the embodiments of the present invention. Further and alternative embodiments, additional details, and the features, aspects, and advantages of the various embodiments of the invention will become more apparent from the detailed description set forth below, the drawings and the claims.

DETAILED DESCRIPTION

Figure 1:
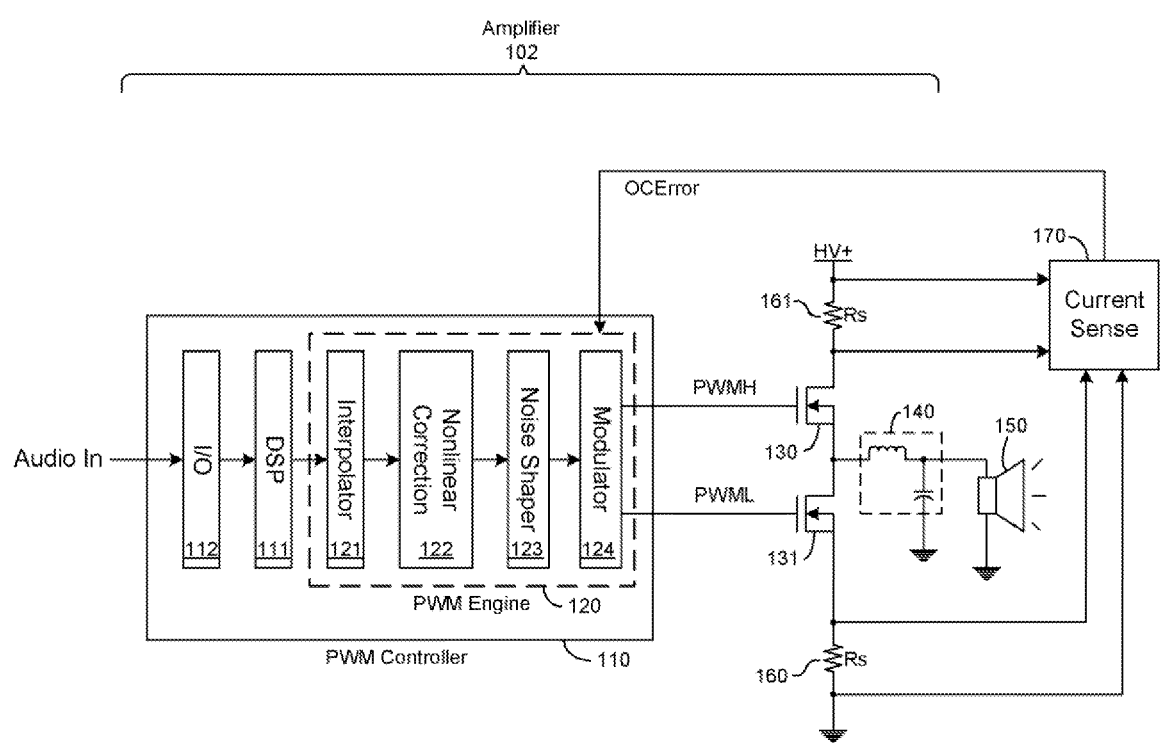
FIG. 1 is a functional block diagram of a typical class-D amplifier with output stage protection.

Embodiments of the present invention relate generally to digital amplifiers and more particularly to systems and methods for implementing over-current protection in all-digital amplifiers while using simple, low-cost current sensing mechanisms.

Audio amplifiers are designed to receive input signals that typically have very low voltages and/or currents, and to generate corresponding output signals that generally have much higher voltages and/or currents. Although these higher voltages/currents are necessary to drive loudspeakers and thereby generate an audible signal, this also presents a danger to the loudspeakers. In other words, if the voltage/current is too high, the loudspeakers could be damaged.

In a pulse-width modulation (PWM) amplifier, preventing the amplifier from generating excessive output current (creating an over-current condition) is one of the most critical functions, since this could damage the amplifier's output stages or the loudspeakers driven by the output stages. The amplifier can avoid over-current conditions in various ways. Probably the most straightforward solution is to simply shut down the system whenever an over-current condition occurs. While this approach is effective to prevent the current from reaching damaging levels, as a practical matter it may not be an acceptable solution. For instance, some audio contents will cause short term over-current conditions that are not damaging to the output stages or loudspeakers. In this scenario, shutting down the system avoids a damaging condition, but does interrupt the audio output of the system, which is not desirable.

Previous systems attempted to avoid shutting down the output stage by clipping the output signal level in response to over-current conditions. When an over-current condition was observed, an internal clip level would be changed from some nominal level to the then-existing amplifier output level. If the over-current condition persisted, the clip level would be continually decreased to further reduce the output level and thus reduce the output current. If the over-current condition was removed, the clip level would be increased until it returned to the nominal level. Additional details of such previous systems are described below with reference to FIGS. 2 and 3.

The previous systems are vulnerable to oscillations in the over-current protection that result in audible artifacts. For large signal levels, the clip level will continually ramp up and down as the output level causes an over-current condition and then as the over-current condition clears. This results in a saw-tooth shaped clipping response that has poor audio qualities. It would therefore be desirable to improve on the clip response to prevent this oscillation.

Various embodiments of the invention are described below. It should be noted that the embodiments described below are exemplary and are intended to be illustrative of the invention rather than limiting.

As described herein, various embodiments of the invention comprise systems and methods for implementing over-current protection in amplifiers while using simple, low-cost current sensing mechanisms.

In one embodiment, a digital pulse width modulation (PWM) amplifier is designed to utilize a simple, low-cost sensing mechanism to monitor the current at the output of the amplifier and to generate a binary signal that indicates whether the current is above or below a threshold level. Based upon this binary signal, the digital amplifier sets a clipping level for the input signal to emulate the clipping in a typical analog system.

In this embodiment, the amplifier includes a PWM controller, an output stage and at least one sensor. The PWM controller is configured to receive an audio input signal and to generate PWM output signals based on the audio input signal. The PWM output signals are provided to the output stage to drive a pair of high voltage power FETs. These FETs are used to generate an analog output signal that is applied to a load such as a loudspeaker.

The sensors are coupled to the output stage and configured to sense the current passing through the FETs. The sensors compare the sensed current to a threshold value to determine whether there is an over-current condition in the output stage. The sensors generate an over-current signal that indicates whether an over-current condition is present. This over-current signal is provided to the PWM controller.

The PWM controller is configured to monitor the over-current signal to determine whether an over-current condition exists in the output stage. In response to detecting an over-current condition, the PWM controller sets a clip level and clips the audio signal to reduce the PWM output signals and the corresponding current through the FETs. The PWM controller adjusts the clip level, decrementing the level until the over-current condition is removed (i.e., no longer detected). This clip level is maintained until the audio signal waveform drops below the clip level and clipping is discontinued for a specified period. After the clipping is discontinued for the specified period, the clip level is incrementally increased and can eventually be returned to its maximum level.

FIG. 1 contains a block diagram illustrating the elements of a PWM amplifier 102 with over-current sensing. The PWM Controller 110 is typically a monolithic integrated circuit device including input/output (I/O) interfaces 112, a digital signal processor (DSP) core for signal processing 111, and a PWM engine 120.

I/O interface 112 receives pulse code modulated (PCM) audio, typically at audio sample rates such as 44.1 kHz, 48 kHz, 96 kHz, or 192 kHz. It will typically support a variety of audio input formats such as S/PDIF, I2S, or HDA. DSP core 111 receives audio samples from the I/O interface, performs signal processing effects such as crossovers, tone controls, or equalizers, and transfers the resulting audio signal to the PWM engine 120. The PWM engine will perform additional signal processing and the PCM to PWM transformation.

The PWM engine includes an interpolator block 121, a nonlinear correction block 122, a noise shaper 123, and a modulator 124. The interpolator block upsamples the audio received from the DSP core from the DSP sampling rate, typically 48 kHz, to the PWM switching rate, typically 384 kHz. The audio is then transferred to the nonlinear correction block. The nonlinear correction block applies a pre-correction to the digital audio signal that approximately corrects for the non-linear artifacts created by the PCM to PWM conversion. The pre-corrected digital audio is then noise-shaped in the noise shaper. The noise shaper typically quantizes the 24-bit PCM digital audio sample to a 10-bit PCM digital audio sample and uses noise shaping techniques to reduce the quantization noise inside the audio band, typically DC to 20 kHz or 40 kHz. The modulator blocks perform the PCM-to-PWM conversion on the 10-bit digital audio and generate digital PWM output signals.

The PWM output signals are used to drive an output stage that includes high voltage power FETs 130 and 131. The output of the high voltage power FETs is filtered by an LC filter 140 to remove the switching carrier. The filter 140 can be part of the amplifier 102, or external to the amplifier. The filtered output of the FET's is then applied to a load 150. This load is typically a loudspeaker that converts the filtered output of the FET's to an audible signal. Different output stages and filters than shown in FIG. 1 may be used.

The over-current protection is also illustrated in FIG. 1. Small value resistors 160 and 161, typically 0.047 ohms, are placed in series with the power supplies to the power FETs 130 and 131. The voltage drop across the resistors is proportional to current and is measured by the current sense block 170 that generates a binary signal, OCError. The current sense block 170 can be part of the amplifier 102, or external to the amplifier. OCError is asserted when the voltage across the sense resistor exceeds a certain threshold. Those skilled in the art will recognize that this is one of many possible ways to detect current in a PWM output stage and generate a binary error signal indicating that the current has exceeded a predetermined threshold.

Some prior systems attempted to limit current to the load by introducing a clipper with a variable clip level in the PWM engine to reduce the maximum output under high current conditions. For example, FIG. 2 contains a flow chart that illustrates an algorithm similar to the one shown in FIG. 3B of U.S. Pat. No. 7,286,010, which is incorporated herein by reference.

Figure 2:
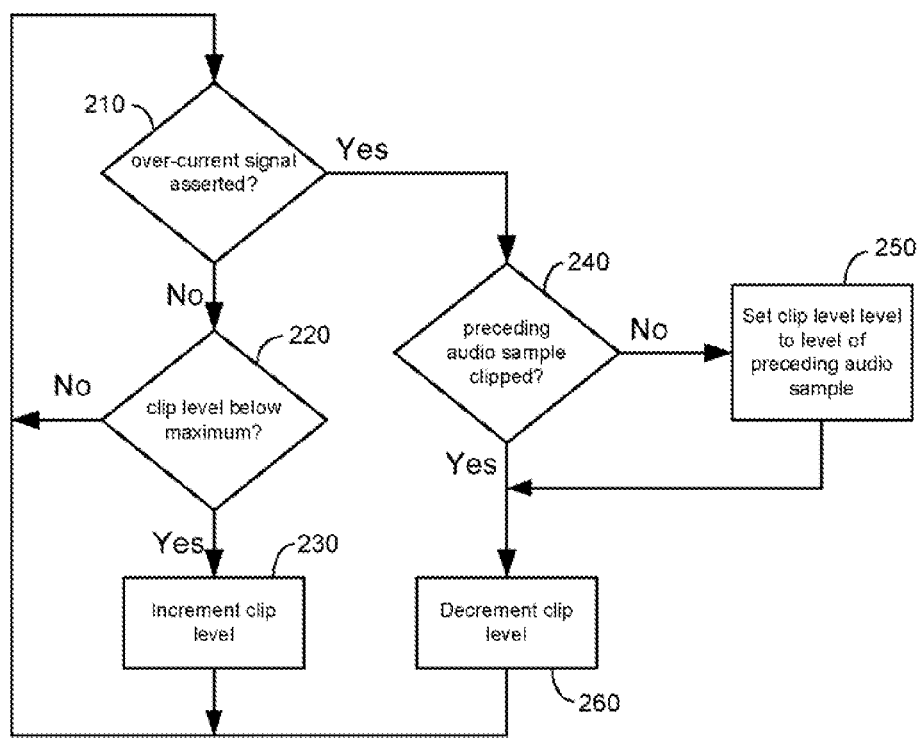
FIG. 2 is a flow diagram illustrating an exemplary current limiting technique.

The clipper begins at maximum level which allows a full amplitude output signal. Every PWM sample period, typically 2.6 microseconds (at a 384 kHz sample rate), the clip level is updated as shown in FIG. 2. If the over-current signal is asserted (210), the system determines if the previous PWM sample was clipped (240). If the previous audio input sample was not clipped (240), the clip level is set to the previous PWM output sample level (250) and then the clip level is decremented from this previous PWM output sample level (260). If the previous PWM sample was clipped, the clip level is decremented from the clip level of the previous PWM sample (260). If the over-current signal is not asserted (210), the clip level is checked to determine whether it is at a maximum level (220). If the clip level is at the maximum level (220), nothing further is done. If the clip level is not at the maximum level (220), the clip level is incremented (230).

It should be noted that references herein to the audio signal and the clip level are made with respect to their corresponding magnitudes, or absolute values. When the clip level is at its maximum level, the audio signal can vary from its full positive amplitude to its full negative amplitude. When the clip level is "decremented" and the audio signal is clipped, the audio signal is limited in both its positive and negative amplitude.

Figure 3:
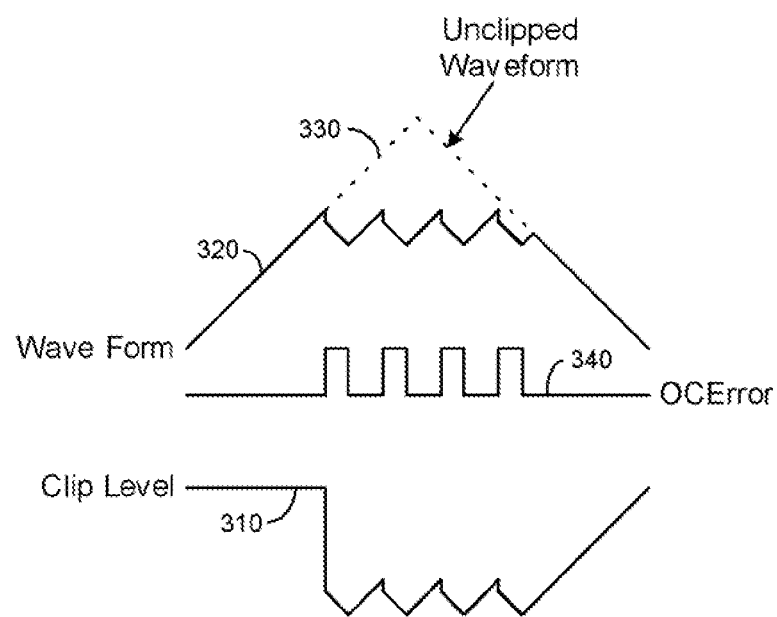
FIG. 3 is an exemplary waveform diagram illustrating current limiting achieved using the technique of FIG. 2.

An exemplary waveform diagram created by applying the technique of FIG. 2 is shown in FIG. 3. In this diagram, a triangle waveform voltage 320 is applied to the output. When the waveform exceeds a certain voltage, the current across the sense resistor causes the OCError signal 340 to be asserted. The clip level 310 is reduced to the previous output level to limit the current. While the error condition persists, the clip level is gradually reduced. When the OCError signal is deasserted, the clip level increases in accordance with the algorithm described in connection with FIG. 2. For comparison purposes, the unclipped triangle waveform 330 is shown. Note that the prior art algorithm results in oscillating clipper behavior that creates a jagged clipping of the intended waveform. This jagged clipping may result in harsh audio artifacts that are unpleasant to the listener.

Specific embodiments of the present invention described below avoid this jagged clipping result by not increasing the clip level while the clipper is clipping the output signal, or more generally, by maintaining the clip level for a specified period once the over-current condition is no longer detected, before allowing the clip level to be increased. Such embodiments are summarized with reference to the flow diagram of FIG. 4. The clipper begins at maximum level, which allows a full amplitude output signal. Every PWM sample period, typically 2.6 microseconds at a 384 kHz sample rate, the clip level is updated. Updates to the clip level can include maintaining, increasing (e.g., incrementing), or reducing (e.g., decrementing) the clip level.

Figure 4:
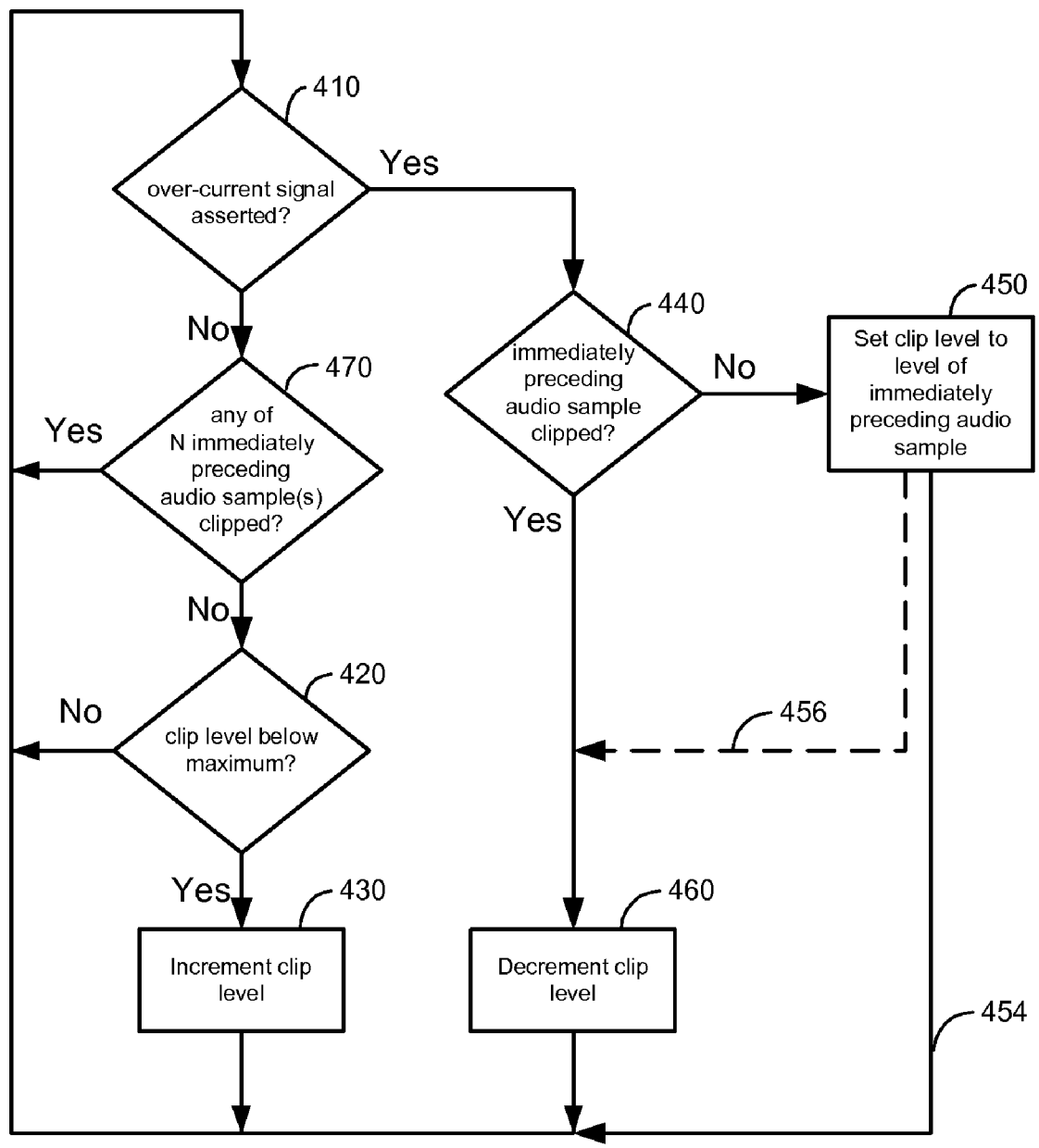
FIG. 4 is a flow diagram illustrating the operation of a current limiting mechanism in accordance with an embodiment of the present invention.

Referring to FIG. 4, at step 410 there is a determination of whether an over-current indicator signal (e.g., OCError) has been asserted, or more generally, whether an over-current condition is detected. If an over-current condition is detected, then at step 440 there is a determination of whether the immediately preceding sample was clipped. If the immediately preceding sample was not clipped (i.e., if the answer to the determination of step 440 is No), then at step 450 the clip level is set to the level of the immediately preceding sample. Thereafter, path 454 can be followed. Alternatively, path 456 can be followed, in which case, after setting the clip level to the level of the immediately preceding sample, the clip level is decremented at step 460 before another check for the over-current condition at step 410. If at step 440 it is determined that the immediately preceding sample was clipped (i.e., if the answer to the determination of step 440 is Yes), then at step 460 the clip level is decremented. The clip level resulting from step 450 and/or 460 can thereafter be used to clip the present sample.

If at step 410 there is a determination that an over-current condition is not detected (e.g., because the over-current indicator signal is deasserted), then at step 470 there is a determination of whether any of the N immediately preceding sample(s) was clipped, where N is an integer that is greater than or equal to 1. If at step 470 there is a determination that at least one of the immediately preceding N samples was clipped, then the clip level is not adjusted before there is another determination (at step 410) of whether an over-current condition is detected for the next sample. Once there is a determination at step 470 that none of the N immediately preceding samples was clipped, then at step 420 there is a determination of whether the clip level is below the maximum. If at step 420 it is determined that the clip level is below the maximum, then at step 430 the clip level is incremented. If at step 420 it is determined that the clip level is not below the maximum (i.e., the clip level is already at the maximum), then the clip level is not incremented. In summary, steps 410 and 470 collectively cause the clip level to be maintained for a specified period, once the over-current condition is no longer detected, before allowing the clip level to be increased. In an embodiment, the specified period, for which the clip level is maintained before the clip level is allowed to be increased, starts when the over-current condition is no longer detected, and ends when each of N immediately preceding sample(s) are not clipped to the clip level (where N is an integer, and N≧1). The higher N is set, the longer the clip level is maintained before the clip level is allowed to be increased. The value for N can be fixed and predefined, or can be programmable.

The amount by which the clip level is decremented at step 460 can be the same as, or different than, the amount by which the clip level is incremented at step 430. The amounts by which the clip level are decremented and incremented can be, e.g., fixed magnitudes, fixed percentages (e.g., 5% of the present clip level), magnitudes that are a linear function of the present clip value, or magnitudes that are an exponential function of the preset clip value, but are not limited thereto.

Figure 5:
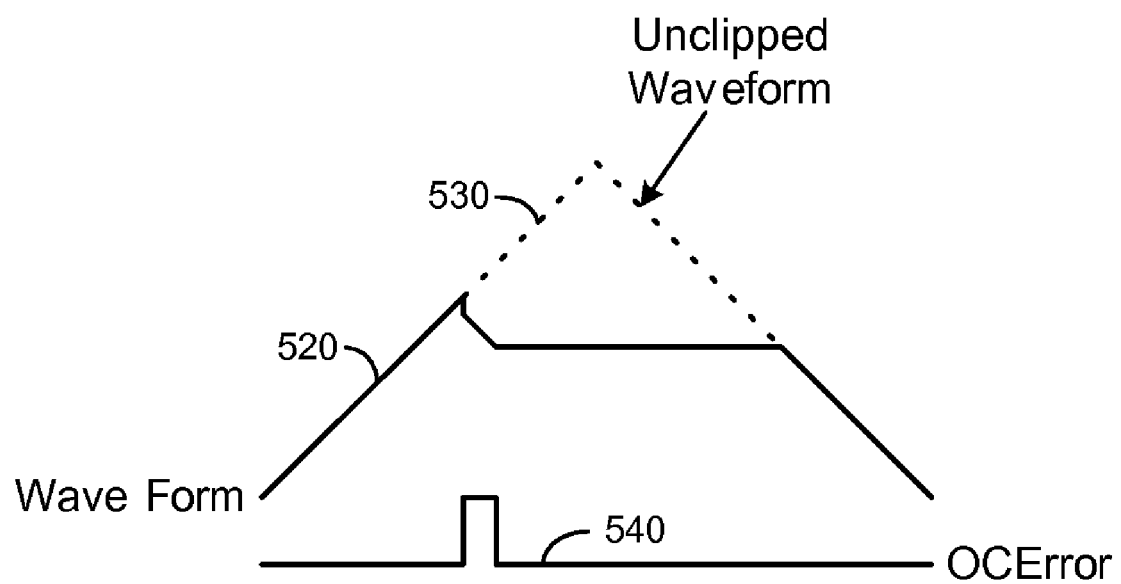
FIG. 5 is an exemplary waveform diagram illustrating current limiting achieved using the technique of FIG. 4.
Figure 5:
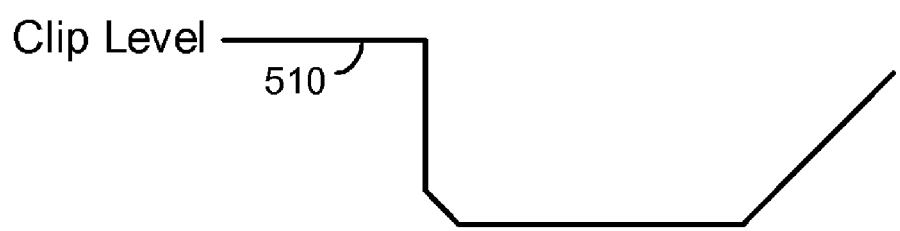

An exemplary waveform diagram created by applying the process of FIG. 4 is shown in FIG. 5. In FIG. 5 a triangle waveform voltage 520 is applied to the output. When the waveform exceeds a certain voltage, the current across a sense resistor (e.g., 160 and/or 161 in FIG. 1) causes the OCError signal 540 (or an alternative over-current indicator signal) to be asserted. The clip level 510 is reduced to the level of the immediately preceding sample to thereby limit the current. While the over-current condition persists, the clip level is gradually reduced. When OCError signal is deasserted, or more generally the over-current condition is no longer detected, the clip level stays constant as long as the output is clipped (and possibly longer, as described above), rather than increasing the clip level as in the technique described with reference to FIGS. 2 and 3. As a result, the amplitude of the output waveform does not increase, and the OCError threshold is not exceeded again. While clipping continues, the OCError signal does not oscillate. After the input waveform level is below the clip level for at least a specified period (e.g., for N samples), the clip level is incrementally increased, allowing the clip level to eventually return the system to its nominal state. For comparison purposes, the unclipped triangle waveform 530 is shown. Such embodiments thereby produce a less harsh clipping behavior that reduces audio artifacts presented to the loudspeaker.

In accordance with specific embodiments, the clipping function is implemented in the PWM engine 120. It is preferable to reduce the delay between the clipping being performed and the final modulated PWM output, though specific design criteria may result in trade-offs between implementation cost and intended effectiveness. Two possible implementation locations are shown in FIGS. 6A and 6B.

Figure 6A:
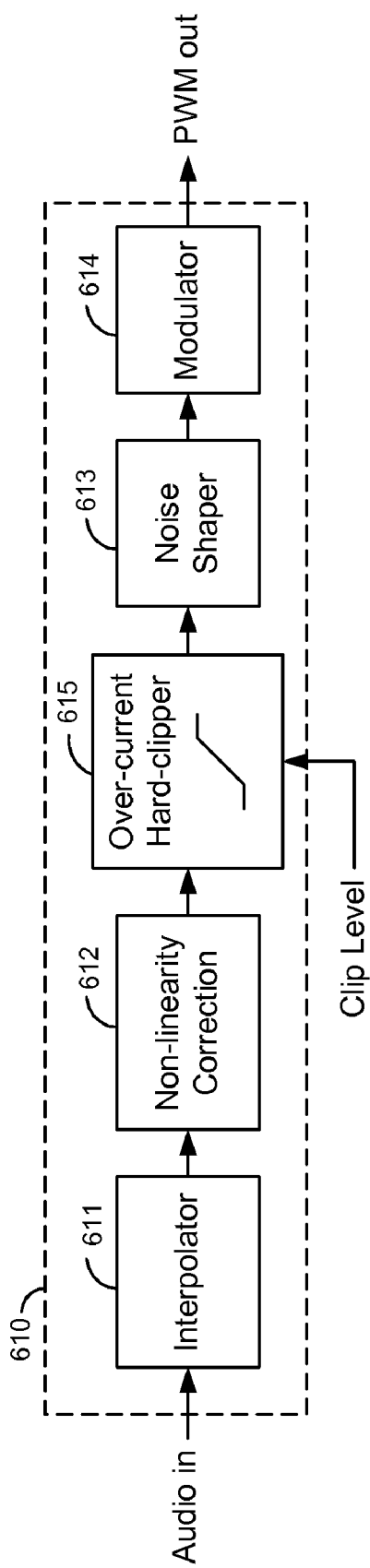
FIGS. 6A and 6B are functional block diagrams illustrating various signal flow placements for an over-current clipping function in accordance with embodiments of the present invention.

In the embodiment of FIG. 6A, PWM engine 610 includes an interpolator 611, a nonlinear correction unit 612, a noise shaper 613 and a modulator 614 in the audio signal path between the input of the PWM engine and its output. The clipping function is implemented in an over-current hard clipper block 615 which is inserted between the nonlinearity correction unit 612 and the noise shaper 613 in the PWM engine signal flow. This has the advantage of computing the clipping level at a high resolution, typically 24 to 28 bits, but has the disadvantage that the noise shaper may alter the final signal level. Exemplary details of an over-current hard clipper block 615 are shown in and described with reference to FIG. 5 of U.S. Pat. No. 7,286,010, which patent was incorporated herein by reference above.

Figure 6B:
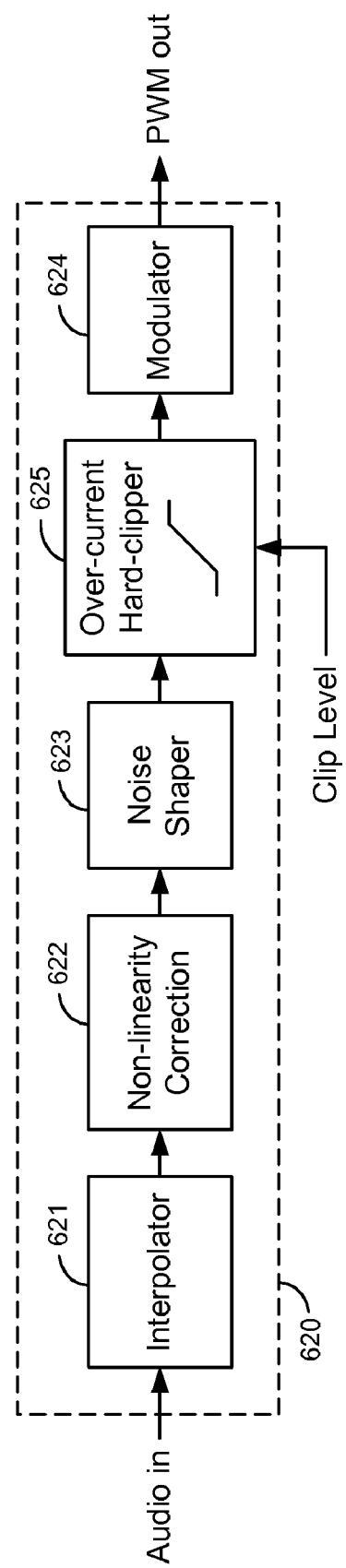

In the embodiment of FIG. 6B, PWM engine 620 also contains an interpolator 621, a nonlinear correction unit 622, a noise shaper 623, and a modulator 624. The clipping function is implemented in the over-current hard clipper block 625, which is positioned between the noise shaper 623 and the modulator 624 in the PWM engine signal flow. This positioning has the disadvantage of computing the clip level at a low resolution, typically 10 bits, but has the advantage of not having any further signal processing affecting the final signal level. Those skilled in the art will recognize that these are two exemplary locations to implement the clipping function, and that the clipping function may be implemented at many other possible locations, which are within the scope of the present invention.

Those of skill in the art will understand that information and signals may be represented using any of a variety of different technologies and techniques. For example, the signals that are referenced in the foregoing description may be represented by voltages, currents, electromagnetic waves, magnetic fields and so on. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software (including firmware) or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation should still be interpreted as being within the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The steps of the methods or algorithms described in connection with the embodiments disclosed herein may be embodied directly in hardware, in software or firmware (program instructions) executed by a processor, or in a combination of the two. Software may reside in RAM memory, flash memory, ROM memory, EPROM memory, EEPROM memory, registers, or any other suitable storage medium.

Some of the various benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While embodiments of the present invention are subject to various modifications and alternative forms, specific embodiments thereof have been shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

While embodiments of the present invention have been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. For use with an amplifier, a method for specifying a clip level at which to clip an audio signal in response to an over-current condition being detected, the method comprising:
    reducing the clip level while the over-current condition is being detected; and
    maintaining the clip level for a specified period, once the over-current condition is no longer detected, before allowing the clip level to be increased.

2. The method of claim 1, wherein the audio signal comprises a digital signal including a plurality of samples, there is a determination of whether an over-current condition is detected for each of the samples, and wherein:
    the specified period, for which the clip level is maintained before the clip level is allowed to be increased,
        starts when the over-current condition is no longer detected, and
        ends when each of N immediately preceding sample(s) are not clipped to the clip level, where N is an integer, and $N \geq 1$.

3. The method of claim 2, where N=1.

4. The method of claim 2, where $N \geq 2$.

5. The method of claim 2, wherein:
    after an over-current condition is no longer detected, and after the clip level has been maintained for the specified period, incrementing the clip level if an over-current condition is not detected for a sample and the clip level is below a specified maximum clip level.

6. The method of claim 1, wherein the audio signal comprises a digital signal including plurality of samples, there is a determination of whether an over-current condition is detected for each of the samples, and in response to an over-current condition being initially detected,
    setting the clip level to a level of an immediately preceding sample, if the immediately preceding sample was not clipped.

7. The method of claim 6, wherein the reducing step includes:
    decrementing the clip level, after the clip level is set to the level of the immediately preceding sample, if the immediately preceding sample was not clipped.

8. The method of claim 6, wherein the reducing step includes:
    decrementing the clip level, if the immediately preceding sample was clipped.

9. The method of claim 1, further comprising monitoring for an over-current condition by:
    receiving an output current resulting from the audio signal, where the audio signal may or may not be clipped, wherein a magnitude of the output current is indicative of a magnitude of an analog signal that will be used to drive a load;
    sensing the magnitude of the output current; and
    comparing the sensed magnitude to a threshold to determine whether an over-current condition is detected.

10. The method of claim 9, further comprising:
    asserting an over-current indicator signal to indicate that an over-current condition is detected, when the sensed magnitude is greater than the threshold; and
    deasserting the over-current indicator signal to indicate that an over-current condition is not detected, when the sensed magnitude is less than the threshold.

11. A device, comprising:
a hard-clipping unit configured to receive an audio signal and an over-current indicator signal, and to selectively clip the audio signal in dependence on the over-current indicator signal;
wherein while the over-current indicator signal indicates that an over-current condition is being detected, the clip level is reduced; and
wherein following an over-current condition being detected, once the over-current indicator signal indicates that the over-current condition is no longer detected, the clip level is maintained for a specified period before the clip level can be increased.

12. The device of claim 11, wherein:
the audio signal comprises a digital signal including a plurality of samples;
there is a determination of whether an over-current condition is detected for each of the samples; and
the specified period, for which the clip level is maintained before the clip level can be increased,
starts when the over-current condition is no longer detected, and
ends when each of N immediately preceding sample(s) are not clipped to the clip level, where N is an integer, and $N \geq 1$.

13. The device of claim 12, wherein:
after an over-current condition is no longer detected, and after the clip level has been maintained for the specified period, the clip level is incremented if an over-current condition is not detected for a sample and the clip level is below a specified maximum clip level.

14. The device of claim 12, wherein when the over-current indicator signal indicates that an over-current condition is initially detected, then:
if the immediately preceding sample was not clipped, the clip level is set to a level of the immediately preceding sample; and
if the immediately preceding sample was clipped, the clip level is decremented.

15. A digital audio amplifier system comprising:
a pulse width modulation (PWM) controller configured to generate PWM output signals based on a digital audio signal including a plurality of samples;
an output stage configured to receive the PWM output signals from the PWM controller and to generate an analog output signal; and
at least one sensor configured to sense a current in the output stage and to generate an over-current indicator signal that indicates whether an over-current condition exists in the output stage for each of the samples;
wherein the PWM controller is also configured to
receive the over-current indicator signal, and based thereon, detect when an over-current condition exists in the output stage,
clip one or more samples of the audio signal to a clip level, while an over-current condition exists in the output stage;
reduce the clip level, while an over current condition exists in the output stage; and
maintain the clip level for a specified period before allowing the clip level to be increased, after an over-current condition that had existed in the output stage no longer to exists.

16. The system of claim 15, wherein the specified period, for which the clip level is maintained before the clip level is allowed to be increased,
starts when the over-current indicator signal indicates that an over-current condition no longer exists, and
ends when each of N immediately preceding sample(s) are not clipped to the clip level, where N is an integer, and $N \geq 1$.

17. The system of claim 15, wherein while an over-current condition exists, the PWM controller is configured to
set the clip level to a level of an immediately preceding sample, if the immediately preceding sample was not clipped, and
decrement the clip level, if the immediately preceding sample was clipped.

18. The system of claim 15, wherein the PWM controller is configured to increment the clip level, after an over-current condition is no longer detected, and after the clip level has been maintained for the specified period, if an over-current condition is not detected for a sample and the clip level is below a specified maximum clip level.

19. The system of claim 15, wherein the PWM controller includes a modulator, and wherein the PWM controller clips the audio signal prior to the modulator in an audio signal path of the PWM controller.

20. The system of claim 19, wherein the PWM controller also includes an interpolator, a non-linearity correction unit, and a noise shaper, each of which precede the modulator in the audio signal path of the PWM controller, and wherein the PWM controller clips the audio signal following at least the interpolator and the non-linearity correction unit in the audio signal path of the PWM controller.

* * * * *